NON-LINEAR RESISTANCE DEVICE

Filed Aug. 12, 1953

2 Sheets-Sheet 1

Inventor:
Jan M. Engel,
by Charles M. Hutchins
His Attorney.

Inventor:
Jan M. Engel,
by Charles M. Hutchins
His Attorney.

United States Patent Office 2,907,934

Patented Oct. 6, 1959

2,907,934

NON-LINEAR RESISTANCE DEVICE

Jan M. Engel, Estell Manor, N.J., assignor to General Electric Company, a corporation of New York Application August 12, 1953, Serial No. 373,828

3 Claims. (Cl. 317—234)

This invention relates to non-linear resistance devices, and more particularly, to such devices utilizing semiconductive material.

Semiconductive devices in which two P-N junctions are placed back-to-back in the same crystal are now known in the art and are commonly termed junction transistors. Such junction transistor devices can be either N-P-N or P-N-P junction transistors, so-called, and each type exhibits similar properties and differ principally in the type of carrier characteristic thereof and in bias polarities required for operation.

Junction transistors, however, require the formation of at least two P-N junctions, which must be accurately positioned relative to each other and which must be separated by a very small distance for optimum performance. As a result, junction transistors are very costly and require complex equipment in their manufacture.

In a copending application of I. A. Lesk, Serial No. 341,164, filed March 9, 1953, patented on November 6, 1956, Patent No. 2,769,726, and assigned to the assignee of the present invention, a novel non-linear resistance device requiring only a single junction is disclosed and claimed wherein an electric field parallel to the plane of the junction is established in the semi-conductive material. Such a single-junction device, as pointed out in the Lesk application, is extremely useful for many purposes heretofore accomplished by junction and/or point-contact transistors.

A principal object of the present invention is to provide certain improvements in the device of the type described in the above-mentioned copending Lesk application.

Another object of this invention is to provide an improved semiconductor amplifying device utilizing only a single P-N junction.

A further object of this invention is to provide an improved semiconductor device that exhibits negative resistance characteristics.

A still further object of this invention is to provide an improved semiconductor device that is useful as a switching relay whereby a small amount of energy controls the flow of a large amount of energy.

Still another object of this invention is to provide an improved photosensitive device that exhibits a great change in electrical conductivity when energized by a light source.

The objects of this invention may be realized through a provision of a bar of semiconductive material having a pair of ohmic contacts, one of which is disposed at or adjacent one end of the bar, the other being disposed at or adjacent the other end of the bar, and a P-N junction formed in the bar. A voltage source connected between the ohmic contacts established a potential gradient therebetween such that the bar may be caused to exhibit negative-resistance characteristics.

The features of this invention which are believed to be novel are set forth with particularly in the appended claims. The invention itself, however, both as to its organization and method of operation, together with further objects and advantages thereof, may best be understood by reference to the following description taken in conjunction with the accompanying drawings wherein:

Figure 1:
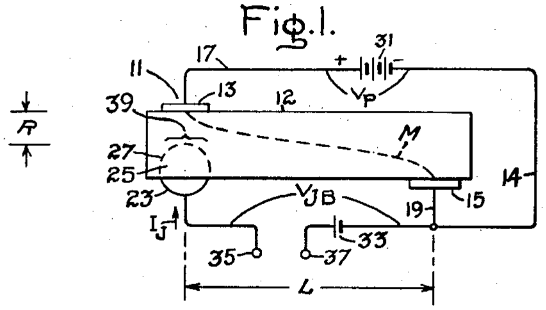
Fig. 1 is an elevational view of a semiconductor device constructed in accordance with the principles of the present invention together with the biasing circuits therefor.

Referring to Fig. 1, a semiconductor device designated generally at 11, comprises an elongated single crystal bar 12, which may be in the form of a parallele-piped or other suitable shape and constituted of any suitable N-type semiconductive material such as germanium, silicon or other suitable material displaying electrical semiconductive properties. As will hereinafter be discussed, the exact dimensions of the bar 12 are to some extent critical. However, for purposes of illustration, the bar 12 is shown diagrammatically and is drawn to a convenient scale.

In the embodiment of the present invention, shown in Fig. 1, a pair of ohmic contacts 13 and 15 are formed, preferably adjacent the opposite ends of the opposed faces of the bar 12. Such ohmic contacts 13 and 15 can be formed, for example, by depositing a metallic film on the bar 12 at the desired point. Terminal conductors 17 and 19 are connected to the contacts 13 and 15.

A P-N junction is provided as by a dot or pellet 23 of a suitable acceptor activator material, such as indium, which may be located on the same face of the bar 12 as the ohmic contact 15, and adjacent the same end of the bar 12 as the ohmic contact 13.

In manufacture of the device, the dot 23 is heated and a portion of the acceptor activator material is fused into the bar 12. Although there are donor activator materials present in the bar 12, sufficient acceptor activators fuse into the bar 12 so that acceptor activators are predominant, and a region 25 contiguous with the dot 23 becomes a region of P-type semiconductive material. In this manner, a rectifying P-N junction, as indicated at 27, is created in the bar 12. The method of producing such a P-N junction is not, in itself, a part of this invention. Suitable methods of, and apparatus for, the construction of such P-N junctions are disclosed and claimed in a copending application of William C. Dunlap, Jr., Serial Number 187,490, filed September 29, 1950, now abandoned, and assigned to the assignee of the present application, to which reference may be made for constructional details.

As thus far described, the bar 12 is considered as being of N-type semiconductive material and the dot 23 is of acceptor activator material. Similar performance characteristics are obtained, however, if the dot 23 is of donor activator material and the bar 21 is a P-type semiconductor material. The principal change necessary is a reversal of the polarity of the bias voltage sources employed therewith.

A suitable source of direct voltage, here indicated by the battery 31, is connected between the terminal conductors 17 and 19 to establish a unidirectional potential gradient in the bar 12. This potential gradient existing in the bar 12 is not axial but rather lies along the dotted line M. The potential has a maximum value at the terminal 13 and a minimum value at terminal 15.

Another source of bias voltage, here shown as battery 33, is connected between the dot 23 and the ohmic contact 15. Input terminals 35 and 37 are inserted in the path between the dot 23 and the contact 15.

Figure 2:
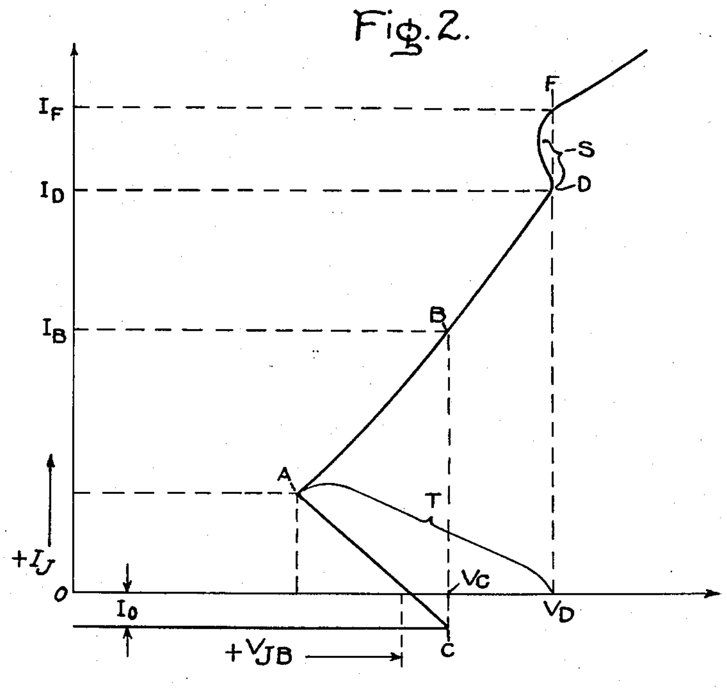
Fig. 2 is a graph useful in explaining the operation of the device shown in Fig. 1.

Fig. 2 shows the curve of the current $I_J$ flowing into the dot 23 plotted against the total voltage $V_{JB}$ applied between the dot 23 and the ohmic contact 15. From inspection of Fig. 2, it can be seen that the curve exhibits two negative resistance regions, indicated at T and S, each being characterized in that a decrease in voltage in such region results in an increase in current.

In explanation of the operation of the device of this invention whereby the negative-resistance effects are obtained, it is helpful to consider a source of variable direct voltage $V_{JB}$ (not shown) connected with the positive terminal thereof at terminal 35 and its negative terminal connected to terminal 37, and the battery 33 short circuited. When the voltage $V_{JB}$ is equal to, or near, zero, the entire area of the junction 27 is biased in the reverse direction as a result of the potential established in an area 39 of the bar of semiconductive material 12 which is contiguous with the junction 27. This potential, established by the battery 31, is positive and attracts negative carriers in the bar 12 away from the junction, thus preventing current flow across the junction 27. This is the condition shown at point 0 of Fig. 2. The small current $I_0$ in Fig. 2 that exists at a value of $V_{JB}=0$ is the diode back current of the junction 27 and is caused by thermally-created holes and electrons.

As the voltage $V_{JB}$ is increased there is no significant change of current until a point C is reached corresponding to $V_{JB}=V_C$. For values of $V_{JB}$ less than $V_C$, the voltage $V_{JB}$ applied between the junction 27 and the ohmic contact 15 is less than any part of the voltage established in the region 39 by the battery 31, and the entire junction 27 remains biased in the reverse direction. At a voltage slightly greater than $V_C$ a portion of the junction 27 becomes biased in the forward direction. That is, the potential of a portion of the area 25 exceeds the potential of the portion of the area 39 on the opposite side of the junction 27 therefrom. When this occurs, holes are injected from the P-type region 25 into the bar 12. These holes move under the influence of the electric field existing in the bar 12 and thus are attracted to the contact 15, traveling through the bar 12 from junction 27 to contact 15. The injection of the holes into the bar 12 is thought to be the factor that contributes to the produciton of the negative resistance region A—C of the characteristic curve to Fig. 2. Qualitatively, the phenomenon may be explained on the basis of the fact that, when minority carriers are injected into a semiconductive material having carriers of the opposite type, the resistance of the semiconductive material may be appreciably lowered. This is especially true of high resistivity semiconductive materials. Since $V=RI$, if I increases, the voltage will decrease only if the percentage decrease in R is greater than the percentage increase in I.

When any part of junction 27 becomes biased in the forward direction, holes are emitted from the P-type region 25 into the N-type region. These injected holes appreciably lower the resistance of the bar 12, especially in the region between the dot 23 and the ohmic contact 15. To obtain the negative resistance region A—C upon carrier injection, it is necessary that the total charge carrier concentration in the bar 12 become relatively large. Otherwise the carriers injected into the bar 12 do not lower the resistance to the required degree because there are only relatively few holes to change the resistance of a large quantity of semiconductive material. If, however, the total amount of semiconductive material is small, the holes injected into the material cause a change in resistance of the semiconductive bar 12 between the dot 23 and the ohmic contact 15 that is appreciable with respect to the original resistance of this region of the bar 12. Thus, as the number of holes injected into the bar 12 increases, that is, the current increases, the resistance of the bar 12 decreases by a larger percentage, thus creating the negative resistance region A—C. In view of the negative resistance characteristic, A—C, it will be seen that a positive increment of $V_{JB}$ beyond the value at $V_C$, produces a disproportionate change in the current from the value at point C to a value $I_B$. Further increase in $V_{JB}$ causes the current to increase smoothly along the portion of the curve BD until $V_{JB}=V_D$, at which point a second negative resistance region S may be encountered, whereby the current $I_J$ varies discontinuously from a value $I_D$ to a value $I_F$.

The negative resistance region S occurs at a value of $V_{JB}$ approximately equal to the voltage of battery 31, $V_P$, and is believed to occur because, as $V_{JB}$ becomes slightly more positive than $V_B$ some of the holes injected across the junction 27 are attracted to the contact 13 instead of being repelled as described above. Thus a portion of the current $I_J$ is carried by holes flowing from dot 23 to the contact 15 and a portion thereof is carried by holes flowing from the dot 23 to the contact 13 instead of the entire current flowing between the dot 23 and the dot 15. In effect, this is similar to introducing a path parallel to a first path in a network, the resistance of the parallel combination being less than the resistance of either path. Since the total resistance of the circuit is thus lowered, the current increases thereby causing the negative resistance region E—D.

The necessity for forming the contacts 13 and 15 adjacent the opposite ends of the bar 12 now becomes apparent especially when the action of minority carriers in a semiconductive material is considered. For optimum operation, the time taken by the injected carriers to traverse the distances between the point of injection, junction 27 and the point of collection, namely contact 15, should be less than the lifetime of the injected minority carriers. If this is not the case, an appreciable fraction of the injected holes combine with the excess electrons in the bar 12 with a resulting loss of injection efficiency. Thus, there is a maximum distance between the junction 27 and the contact 15 for optimum operation.

However, it is also important that the configuration of the device be such that as large a change in potential as possible occur in the portion of the bar 12 adjacent the junction 27 with respect to contact 15 when holes are injected. This is necessary so that as many carriers as possible can be injected into the bar 12 because the greater the number of injected carriers is, the greater is the change in resistance between dot 23 and contact 15. To satisfy these criteria the distance R between the dot 23 and the contact 13 should be made small relative to the distance L between dot 23 and contact 15.

Figure 3:
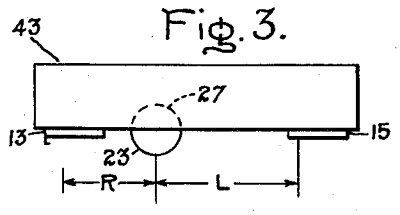
Fig. 3 shows a modified construction of the device illustrated in Fig. 1.

Fig. 3 illustrates one arrangement constructed according to this invention to meet the criteria discussed hereinabove. The device 43 is generally similar to the device 12 of Fig. 1. However, here the dot 23 is offset from the midpoint of the face of the bar 12 so that it is nearer the contact 13 than the contact 15 thus increasing the ratio of L to R.

It is possible to make the ratio of L to R even greater by placing the contact 13 on the opposite side of the bar, as shown. The distance R is then made small by utilizing a thin bar 12 and by fusing the junction 27 deeply therein. In this embodiment of the device, injection from the junction 27 is in a direction not perpendicular to the potential gradient existing in the bar 12, that is, the plane of the junction 27 is not parallel to the potential gradient existing in the bar 12. Thus the embodiment of the device 11 shown in Fig. 1 is the preferred embodiment, since with the non-perpendicular arrangement a greater change in current is caused when the voltage exceeds the critical voltage level. In a successfully operating embodiment, with a value of $V_P$ approximately equal to 5 volts, the dimensions of the bar 12 were approximately .2 inch long by .05 inch wide by .01 thick.

Figure 4:
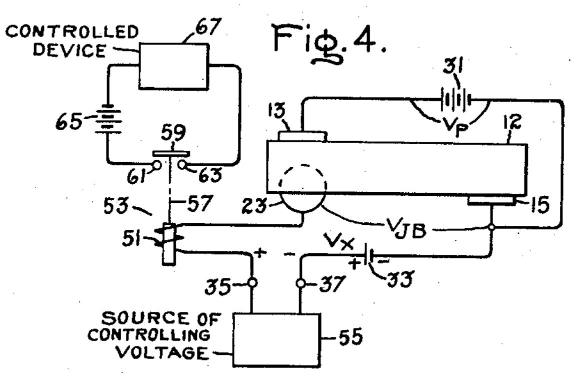
Fig. 4 is a schematic circuit diagram of an improved relay circuit arrangement embodying the semiconductive device of Fig. 1.

Fig. 4 shows a relay circuit utilizing the semiconductor device 11. As in Fig. 1, the battery 31 establishes a unidirectional potential in the bar 12. The magnitude $V_X$ of the potential of battery 33 is set at a value slightly less than C (Fig. 2) and a coil 51 of a marginal relay 53 is connected in series with the battery 33. The marginal relay 53 is adjusted so that it is insensitive to the normal flow of current through the coil 51. A source of controlling voltage 55 is connected to terminals 35 and 37 in series with the battery 33 so that the voltages are additive.

When a controlling voltage pulse $V_g$ is applied to the terminals 35 and 37 from the source 55, the pulse voltage $V_g$ adds to the voltage $V_X$ and because of the negative resistance region A—C (Fig. 2) a rapid increase of current occurs, the magnitude of current changing from the value at point C to the value at point B, as hereinabove described. This increase in current flowing through the coil 51 of the marginal relay 53 sensitizes the relay and causes a plunger 57 to pull down a shorting bar 59 which makes electrical contact between terminals 61 and 63. As a result of the shorting of terminals 61 and 63, current from a source of potential 65 flows through a device 67 to be controlled thereby energizing it. If desired, the normally open marginal relay 53 can be replaced by a normally closed relay, the only difference being that contact is broken instead of made when the current flowing through coil 51 increases.

Figure 5:
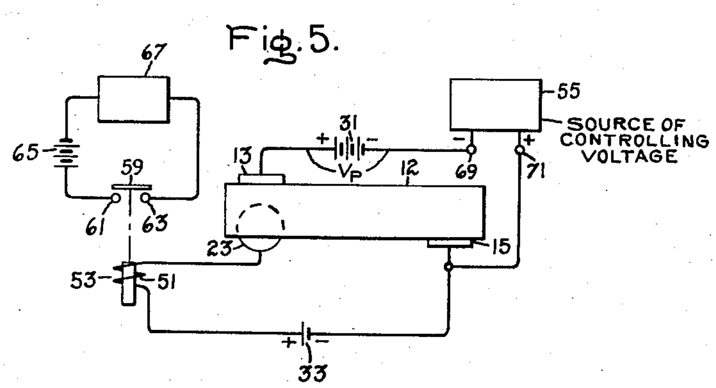
Fig. 5 is a schematic circuit diagram of a modification of the arrangement illustrated in Fig. 4.

Fig. 5 illustrates a modification of the circuit shown in Fig. 4. In this modification the controlling voltage pulse $V_g$ from source 55 is applied to terminals 69 and 71, the polarities of $V_g$ being as shown. The polarity of the voltage pulse $V_g$ is such as to subtract from the magnitude, $V_P$, of the voltage battery 31. When a controlling pulse is impressed between terminals 69 and 71, the voltage between contacts 13 and 15 of the device 11 is decreased. This decrease in voltage lowers the value of the field in device 11 to a point where the voltage $V_k$ is intermediate the values of voltage at the sides of dot 23. As previously explained, this condition results in a negative resistance characteristic for the current flowing through the dot 23. Therefore, the current increases from a value at point C (Fig. 2) to the value at point B and thus operates marginal relay 45 as explained in the discussion of the apparatus of Fig. 4.

Figure 6:
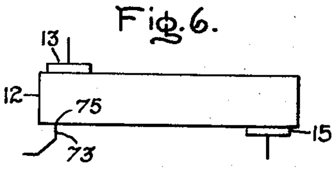
Fig. 6 is an elevational view of another modified construction of the semiconductor device of this invention.

Fig. 6 illustrates a modification of the device shown in Fig. 1. In this modification, the device 12 is similar to that described hereinabove in connection with the device of Fig. 1. The dot 23 of Fig. 1 embodiment is replaced by a point-contact electrode in the form of a cat's whisker 73 (Fig. 6) and minority carriers are injected into the bar 12 from the point contact 75 instead of through the junction 27 as shown in Fig. 1. In all respects the operation of the device depicted in Fig. 6 is the same as that of the device shown in Fig. 1.

Figure 7:
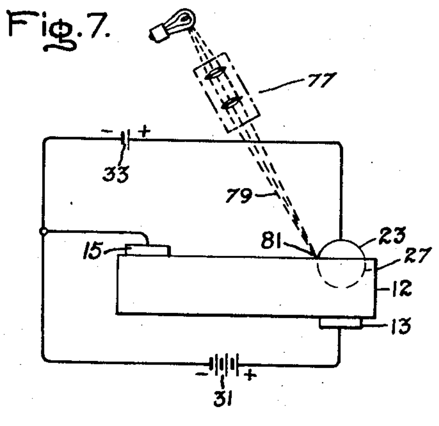
Fig. 7 is a schematic diagram illustrating the device of this invention arranged to utilize the photosensitive properties thereof.

Referring now to Fig. 7, a photosensitive device is therein shown which embodies the principles of the present invention. A source of light 77 is positioned so that light rays 79 are directed at an area 81 where the dot 23 joins the surface of the bar 12. Bias is supplied between contacts 13 and 15 by the battery 31, and between dot 23 and contact 15 by the battery as described in connection with Fig. 1.

When the light source 77 is energized, the current flowing through the junction 27 increases from the value at point C (Fig. 2) to the value at point B. This increase in current is caused by a decrease in resistance of the bar 12. When light is directed at the junction 27, electrons in the semiconductive material are raised to higher energy states by the photons of the light beam, and thus additional hole-electron pairs are created which lower the resistance of the semiconductive material as described above.

Depending on the relative values of the voltages of batteries 31 and 33, two results are possible when the light source 77 is deenergized. If the voltage of battery 33 is smaller than the value at A (Fig. 2), when the light source 77 is deenergized the current flowing through junction 27 will return to its previous value. However, if the voltage of the battery 31 is equal or larger than voltage at point A, when the light source 77 is deenergized, the current will remain at a value greater than the current at point A. Thus this photosensitive device will serve as a memory device and indicate whether the light source 77 has been energized at any time.

While certain specific embodiments have been shown and described, it will, of course, be understood that various modifications may be made without departure from the invention. The appended claims are, therefore, intended to cover any such modifications within the true spirit and scope of the invention.

What I claim as new and desire to secure by Letters Patent of the United States is:

1. A semiconductor device comprising a bar of semiconductor material of one conductivity type having first and second ohmic contacts near opposite ends thereof, one of said ohmic contacts being on a side of said bar, and a region of opposite conductivity type near one end of said bar and opposite said one of said ohmic contacts, said region forming a P–N junction with said bar.

2. A semiconductor device comprising a bar of semiconductor material of one conductivity type having first and second ohmic contacts near opposite ends thereof, each of said ohmic contacts being on a side of said bar, and a region of opposite conductivity type near one end of said bar and opposite one of said contacts, said region forming a P–N junction with said bar.

3. A semiconductor device comprising a bar of semiconductor material of one conductivity type having first and second ohmic contacts near opposite ends thereof, one of said ohmic contacts being on a side of said bar, the other of said ohmic contacts being on the opposite side of said bar, and a region of opposite conductivity type near one end of said bar and opposite said one of said ohmic contacts, said region forming a P–N junction with said bar.

References Cited in the file of this patent

UNITED STATES PATENTS

| | | |
|---|---|---|
| 2,502,479 | Pearson et al. | Apr. 4, 1950 |
| 2,553,491 | Shockley | May 15, 1951 |
| 2,644,852 | Dunlap | July 7, 1953 |
| 2,735,919 | Shower | Feb. 21, 1956 |
| 2,754,431 | Johnson | July 10, 1956 |
| 2,769,926 | Lesk | Nov. 6, 1956 |
| 2,863,056 | Pankove | Dec. 2, 1958 |